United States Patent
Terao (10) Patent No.: US 7,332,448 B2
(45) Date of Patent: Feb. 19, 2008

(54) MANUFACTURING METHOD OF SEMICONDUCTOR DEVICE AND SEMICONDUCTOR MANUFACTURING DEVICE

(75) Inventor: Shinji Terao, Nagano (JP)

(73) Assignee: Seiko Epson Corporation (JP)

( * ) Notice: Subject to any disclaimer, the term of this patent is extended or adjusted under 35 U.S.C. 154(b) by 236 days.

(21) Appl. No.: 11/207,064

(22) Filed: Aug. 18, 2005

(65) Prior Publication Data

US 2006/0057860 A1    Mar. 16, 2006

(30) Foreign Application Priority Data

Sep. 10, 2004   (JP)   ............... 2004-263372

(51) Int. Cl.
*H01L 21/00*    (2006.01)
(52) U.S. Cl. ............... 438/795; 438/799; 257/E21.285
(58) Field of Classification Search ............... 438/795, 438/799; 257/E21.285
See application file for complete search history.

(56) References Cited

U.S. PATENT DOCUMENTS 5,500,388 A * 3/1996 Niino et al. ............... 438/482
7,217,578 B1 * 5/2007 McBride et al. ............... 438/5
2002/0148135 A1 * 10/2002 Kawase ............... 34/72
2003/0109071 A1 * 6/2003 Wang et al. ............... 438/14
2004/0087180 A1 * 5/2004 Hishiya et al. ............... 438/770
2005/0201894 A1 * 9/2005 Suzuki et al. ............... 422/62

FOREIGN PATENT DOCUMENTS

JP     07-074166     3/1995

* cited by examiner

*Primary Examiner*—Trung Dang
(74) *Attorney, Agent, or Firm*—Harness, Dickey & Pierce, P.L.C.

(57) ABSTRACT

A manufacturing method of a semiconductor device, comprises; a process of heat-treating a semiconductor substrate under the ordinary pressure and in an oxidizing atmosphere; and a process of heat-treating the semiconductor substrate under the ordinary pressure and in an inert atmosphere, wherein heat-treating time or heat-treating temperature in heat treatment in the oxidizing atmosphere is changed based on the fluctuation of atmospheric pressure, and the heat-treating time in the inert atmosphere is determined based on the heat-treating time or the heat-treating temperature in the oxidizing atmosphere.

9 Claims, 10 Drawing Sheets

MANUFACTURING METHOD OF SEMICONDUCTOR DEVICE AND SEMICONDUCTOR MANUFACTURING DEVICE

RELATED APPLICATIONS

This application claims priority to Japanese Patent Application No. 2004-263372 filed Sep. 10, 2004 which is hereby expressly incorporated by reference herein in its entirety.

BACKGROUND OF THE INVENTION

1. Technical Field

The present invention relates to a manufacturing method of a semiconductor device and a semiconductor manufacturing device. Particularly, the invention relates to a manufacturing method of a semiconductor device and a semiconductor manufacturing device capable of decreasing scattering of a thermal history resulting in a semiconductor device during manufacture.

2. Related Art

Figure 10:
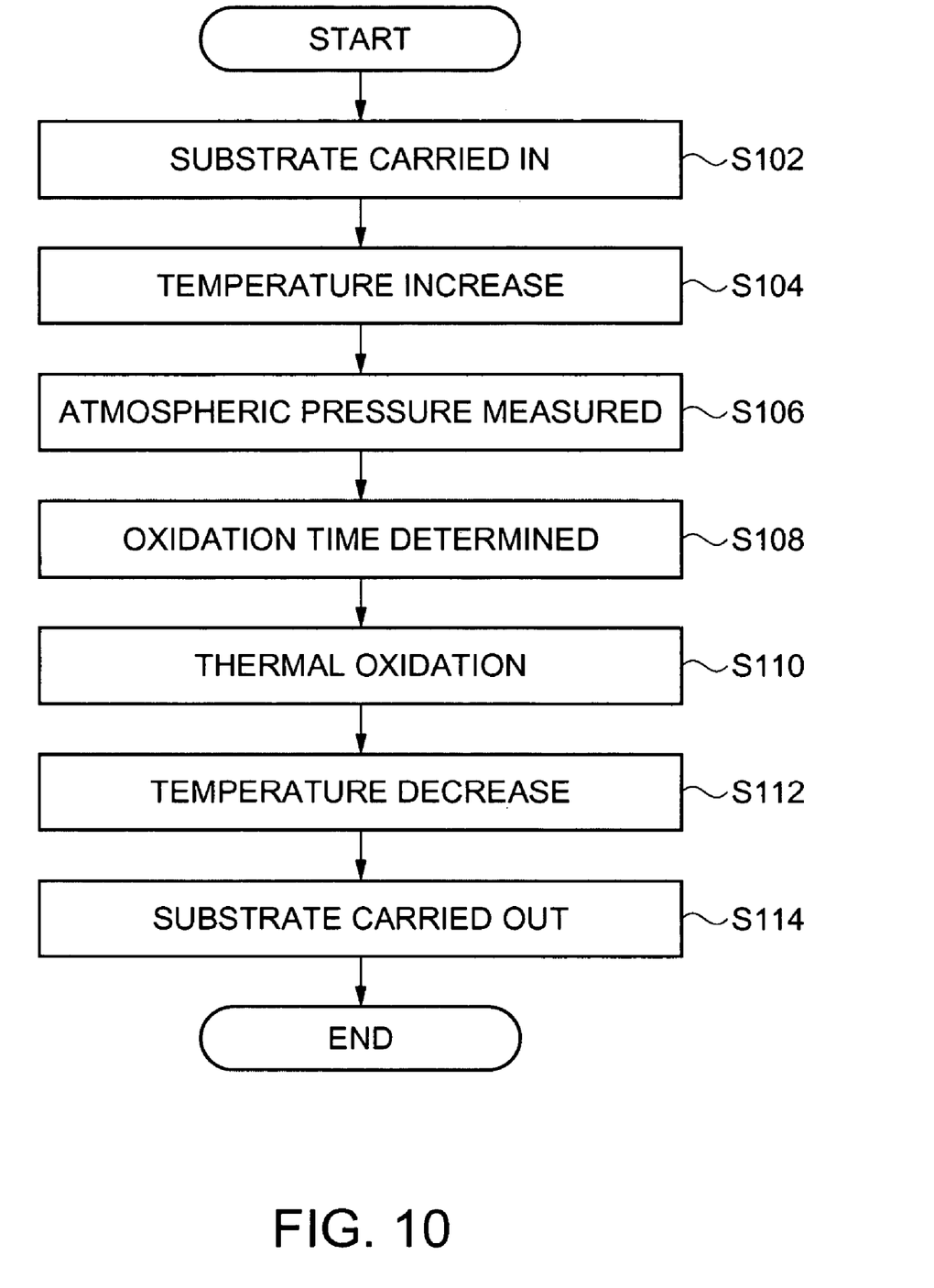
FIG. 10 is a flowchart to explain a manufacturing method of a currently available semiconductor device.

FIG. 10 is a flowchart for explaining a currently available method of manufacturing a semiconductor device. The flowchart shows a process of forming a gate oxide film of a transistor through thermal oxidation of a silicon substrate by using an ordinary pressure thermal oxidation furnace. A thickness of the gate oxide film considerably affects transistor performance. Consequently, it is necessary to decrease scattering of the thickness of the gate oxide film.

On the other hand, since an atmospheric pressure is undergoing a change every minute, a partial pressure of oxygen inside the thermal oxidation furnace is also undergoing a change every minute. Hence, to keep the thickness of the gate oxide film at a fixed level, it is necessary to adjust heat-treating time, heat-treating temperature and the like in keeping with fluctuation of the atmospheric pressure. Examples of adjusting thermal oxidation time according to the fluctuation of the atmospheric pressure will be described as follows.

First, a silicon substrate is carried into the thermal oxidation furnace (S102). Next, a temperature of the thermal oxidation furnace is raised (S104). Further, the atmospheric pressure is gauged (S106), and oxidation time is determined according to the result of gauging (S108). Specifically, as the atmospheric pressure decreases, the oxidation time is extended.

When the temperature of the thermal oxidation furnace reaches a specified temperature (for example, 900° C.), by keeping that temperature as long as the determined oxidation time, a surface of the silicon substrate is thermally oxidized (S110). After a lapse of the determined time, the temperature of the thermal oxidation furnace is lowered (S112), and the silicon substrate after thermal oxidation is carried out (S114). Such technology is disclosed, for example, in Japanese Unexamined Patent Publication No. Hei7-74166.

In a case where the thermal oxidation time or the heat-treating temperature is made to change based on the fluctuation of the atmospheric pressure, the thermal history of the semiconductor substrate varies per lot. Therefore, there is a possibility of the characteristics of the semiconductor device being different per lot. Especially, in the case where an impurity is introduced into the semiconductor substrate prior to thermal oxidation, since a diffusion profile of the impurity is different per lot, there is a possibility that the electrical characteristics of the semiconductor device are different per lot.

Further, in CVD processing, pressure is a key parameter to determine a rate of deposition. In case of carrying out CVD under the ordinary pressure, to make the film thickness constant, the atmospheric pressure is gauged, while CVD processing time or processing temperature may sometimes be adjusted based on the result of this gauging. In this case, there is a possibility that even in the CVD processing under the ordinary pressure, the thermal history of the semiconductor substrate is different per lot and that the characteristics of the semiconductor device are different per lot.

SUMMARY

An advantage of the invention is to provide a manufacturing method of a semiconductor device, which can reduce scattering of the thermal history resulting in the semiconductor device at time of manufacture, and a semiconductor manufacturing device.

According to a first aspect of the invention, a manufacturing method of a semiconductor device includes: a process of heat-treating a semiconductor substrate under the ordinary pressure and in an oxidizing atmosphere; and a process of heat-treating the semiconductor substrate under the ordinary pressure and in an inert atmosphere, wherein heat-treating time or heat-treating temperature in the heat treatment in the oxidizing atmosphere is changed based on the fluctuation of the atmospheric pressure, and the heat-treating time in the inert atmosphere is determined based on the heat-treating time or the heat-treating temperature in the oxidizing atmosphere.

According to the manufacturing method of the semiconductor device, the heat-treating time in the inert atmosphere is determined based on the heat-treating time or the heat-treating temperature in the oxidizing atmosphere. Consequently, even if the heat-treating time or the heat-treating temperature should fluctuate in the oxidizing atmosphere, it is possible to reduce the scattering of the thermal history of the semiconductor substrate.

In the process of heat-treating in the inert atmosphere, it is preferable to change or control the heat-treating time of the semiconductor substrate such that the thermal history of the semiconductor substrate is substantially constant.

Further, in the process of heat-treating in the inert atmosphere, it is preferable to put the heat-treating temperature substantially the same as the heat-treating temperature in the oxidizing atmosphere.

Even if the heat-treating time or the heat-treating temperature should fluctuate in the oxidizing atmosphere, such arrangement could facilitate suppressing the fluctuation of the thermal history of the semiconductor substrate.

In the heat treatment in the oxidizing atmosphere, the heat-treating time may be changed based on the fluctuation of the atmospheric pressure, so that the heat-treating time in the heat treatment in the inert atmosphere may be set such as to make a sum of the heat-treating time in the inert atmosphere and the heat-treating time in the oxidizing atmosphere substantially constant. Even if the heat-treating time should fluctuate in the oxidizing atmosphere, such arrangement could facilitate suppressing fluctuation of the thermal history of the semiconductor substrate.

A manufacturing method of a semiconductor device according to the invention includes: a process of heat-treating a semiconductor substrate under the ordinary pressure and in the oxidizing atmosphere; and a process of decreasing a temperature of the semiconductor substrate after oxidation processing, wherein the heat-treating time or the heat-treating temperature in the heat treatment in the oxidizing atmosphere is changed based on the fluctuation of atmospheric pressure, and in the process of decreasing the temperature of the semiconductor substrate, a rate of decreasing the temperature after the oxidation processing of the semiconductor substrate based on the heat-treating time or the heat-treating temperature is set.

According to the manufacturing method of the semiconductor device, the rate of decreasing the temperature after the oxidation processing is determined based on the heat-treating time or the heat-treating temperature in the oxidizing atmosphere. Consequently, even if the heat-treating time or the heat-treating temperature should fluctuate in the oxidizing atmosphere, it is possible to suppress fluctuation of the thermal history of the semiconductor substrate.

In the process of decreasing the temperature of the semiconductor substrate having a process of injecting the impurity into the semiconductor substrate prior to the process of heat-treating in the oxidizing atmosphere, the rate of decreasing the temperature of the semiconductor substrate may be set based on a diffusion coefficient of the impurity, the heat-treating temperature of the semiconductor substrate, and a concentration of the impurity in the semiconductor substrate in addition to the heat-treating time in the oxidizing atmosphere.

The heat-treating process in the oxidizing atmosphere is, for example, a process of forming a gate oxide film on the semiconductor substrate.

There may well be a process of injecting the impurity into the semiconductor substrate prior to the process of heat-treating in the oxidizing atmosphere. In this case, because it is difficult for the thermal history to fluctuate, it becomes difficult for the profile of the impurity to scatter. Consequently, it becomes difficult for the electrical characteristics of the semiconductor device manufactured to scatter.

The process of injecting the impurity into the semiconductor substrate is, for example, a process of forming a well in the semiconductor substrate.

The manufacturing method of a semiconductor device according to the invention includes: a process of subjecting the semiconductor substrate to CVD processing under the ordinary pressure and in a heated condition; and a process of heat-treating the semiconductor substrate under the ordinary pressure and in the inert atmosphere, wherein the heat-treating time in the inert atmosphere is determined based on the CVD processing time.

The manufacturing method of another semiconductor device according to the invention includes: a process of subjecting the semiconductor substrate to the CVD processing under the ordinary pressure and in the heated condition; and a process of setting the rate of decreasing the temperature after CVD processing of the semiconductor substrate based on the CVD processing time and decreasing the temperature of the semiconductor substrate according to the set rate.

The semiconductor manufacturing device according to the invention includes: a reaction chamber housing a semiconductor substrate under the ordinary pressure; a reactive gas supply section supplying a reactive gas to the reaction chamber; an inert gas supply section supplying an inert gas to the reaction chamber; a heating section to heat the semiconductor substrate in the reaction chamber; and a control controlling the heating section, the reactive gas supply section, and the inert gas supply section, the control including; a function of subjecting the semiconductor substrate to the oxidation processing by operating the heating section while in a condition of causing the reactive gas to be supplied to the reaction chamber in the reactive gas supply section, a function of heat-treating to adjust the processing time by supplying the inert gas to the reaction-chamber in the inert gas supply section while in a condition in which, after the oxidation processing, supply of the reactive gas to the reactive gas supply section is completed, and the heating section is put in operation, a function of changing time or temperature of the oxidation processing based on the fluctuation of the atmospheric pressure, and a function of determining the heat-treating time for the adjustment based on the time or the temperature of the oxidation processing.

Still another semiconductor manufacturing device according to the invention includes: a reaction chamber housing a semiconductor substrate under the ordinary pressure; a reactive gas supply section supplying the reactive gas to the reaction chamber; an inert gas supply section supplying the inert gas to the reaction chamber; a heating section to heat the semiconductor substrate in the reaction chamber; and a control controlling the heating section, the reactive gas supply section, and the inert gas supply section, the control including; a function of subjecting the semiconductor substrate to the oxidation processing by operating the heating section while in a condition of causing the reactive gas to be supplied to the reaction chamber in the reactive gas supply section, a function of changing the time or the temperature of the oxidation processing based on the fluctuation of the atmospheric pressure, and a function of setting the rate of decreasing the temperature of the semiconductor substrate after the oxidation processing based on the time or the temperature of the oxidation processing.

These semiconductor manufacturing devices may be, for example, a thermal oxidizing device thermally oxidizing a semiconductor substrate or a CVD device. In the case of the former, the reactive gas supply section supplies oxygen or water vapor to the reaction chamber.

BRIEF DESCRIPTION OF THE DRAWINGS

The invention will be described with reference to the accompanying drawings, wherein like numbers refer to like elements, and wherein.

DESCRIPTION OF THE EMBODIMENTS

Figure 1:
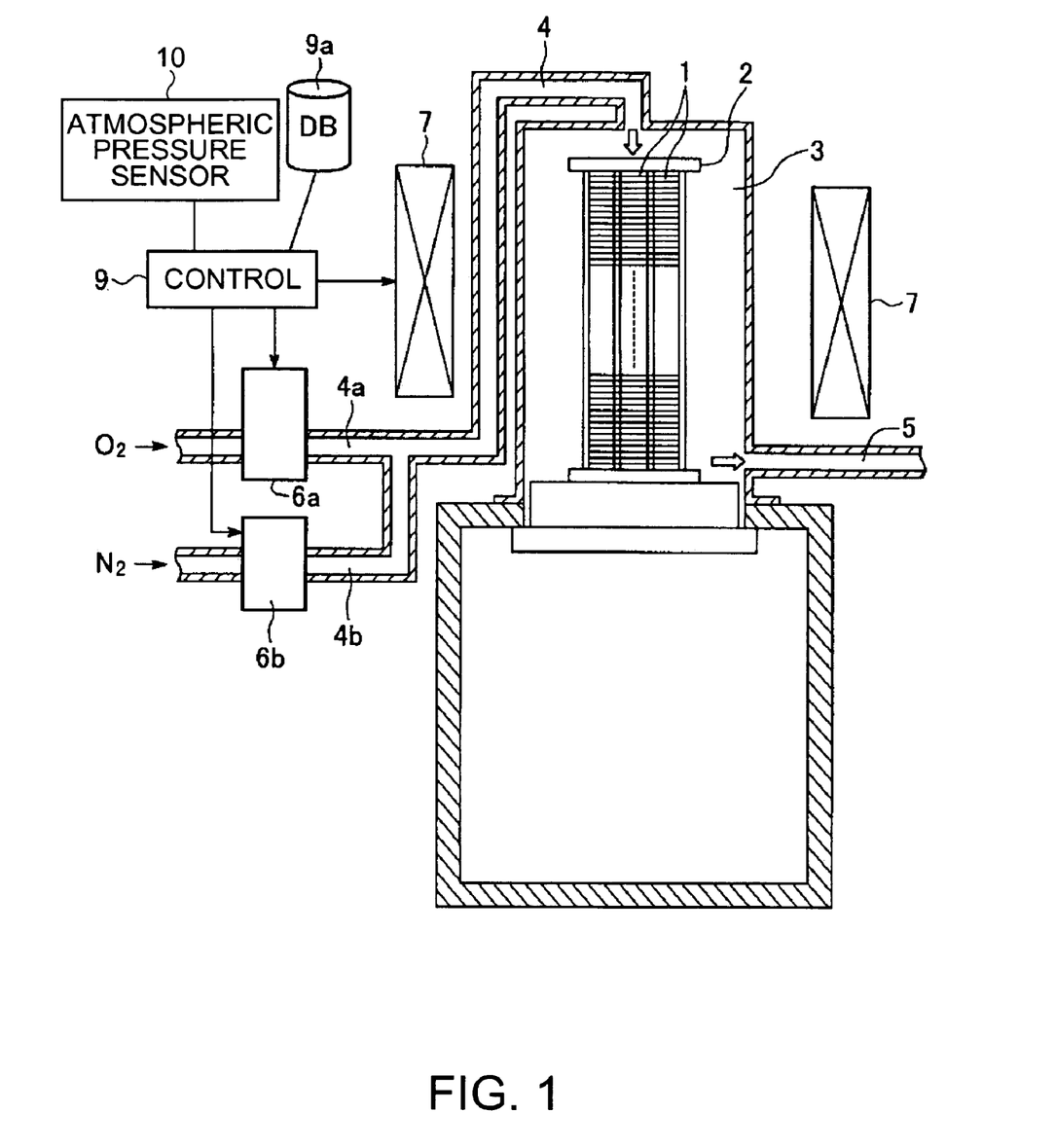
FIG. 1 is a schematic diagram showing a configuration of a semiconductor manufacturing device according to a first embodiment of the invention.

Embodiments of the invention will now be described with reference to the accompanying drawings. FIG. 1 is a schematic diagram showing a configuration of a semiconductor manufacturing device according to a first embodiment of the invention. This semiconductor manufacturing device is a thermal oxidizing furnace of an ordinary pressure type which thermally oxidizes a silicon wafer 1, and a wafer boat 2 is arranged inside a reaction chamber 3. The wafer boat 2 holds a plurality of silicon wafers 1 and can be inserted or removed from below the reaction chamber 3.

A heater 7 is provided outside the reaction chamber 3. The heater 7 heats the silicon wafers 1 inside the reaction chamber 3 and keeps temperature of the silicon wafers 1 constant. Operation of the heater 7 is controlled by a control 9.

A gas supply pipe 4 and a gas discharge pipe 5 are linked to the reaction chamber 3. Upstream of the gas supply pipe 4 is branched to gas supply tubes 4a and 4b. The gas supply tube 4a supplies an oxidation seed (for example, oxygen or water vapor, or both of these), while the gas supply tube 4b supplies nitrogen which is an example of an inert gas or Ar. Flow rate control mechanisms 6a and 6b are respectively provided in the gas supply tubes 4a and 4b. The flow rate control mechanisms 6a and 6b are controlled by the control 9.

In addition to the processing temperature, the thermal oxidation rate is affected by the partial pressure of the oxidation seed inside the reaction chamber 3. Since the sealing property of the reaction chamber 3 is not too high, pressure inside the reaction chamber 3 is in a state of ordinary pressure, that is, hardly subject to discharge and pressurization. As a result, the partial pressure of the oxidation seed inside the reaction chamber 3 fluctuates according to the atmospheric pressure, causing the thermal oxidation rate to fluctuate due to the atmospheric pressure.

On the other hand, an atmospheric pressure sensor 10 is provided in the semiconductor manufacturing device. The atmospheric pressure sensor 10 is, for example, set up outside the reaction chamber 3, outputting the gauged atmospheric pressure to the control 9. The control 9 maintains a thickness of the thermal oxidation film constant by changing the time of thermal oxidation processing based on the inputted atmospheric pressure. It should be noted that for determining the time of the thermal oxidation processing, in addition to the atmospheric pressure, the thickness of the thermal oxidation film and data stored in database 9a are used.

This data is, for example, data of chart format which compares the atmospheric pressure to the oxidation rate, or a numerical expression indicating a relationship between the atmospheric pressure and the oxidation rate. It should be noted that other data may be stored in the database 9a as necessary.

In this way, in the semiconductor manufacturing device, as the atmospheric pressure fluctuates, thermal oxidation processing time of the silicon wafer 1 or its thermal history fluctuates. However, because the thermal history of the silicon wafer 1 affects the characteristics of the semiconductor device (for example, a transistor, a capacitor, or a resistance element) formed on the silicon wafer 1, it is preferable to be constant.

Accordingly, the semiconductor manufacturing device operates as follows to absorb this fluctuation of the thermal history.

Figure 2:
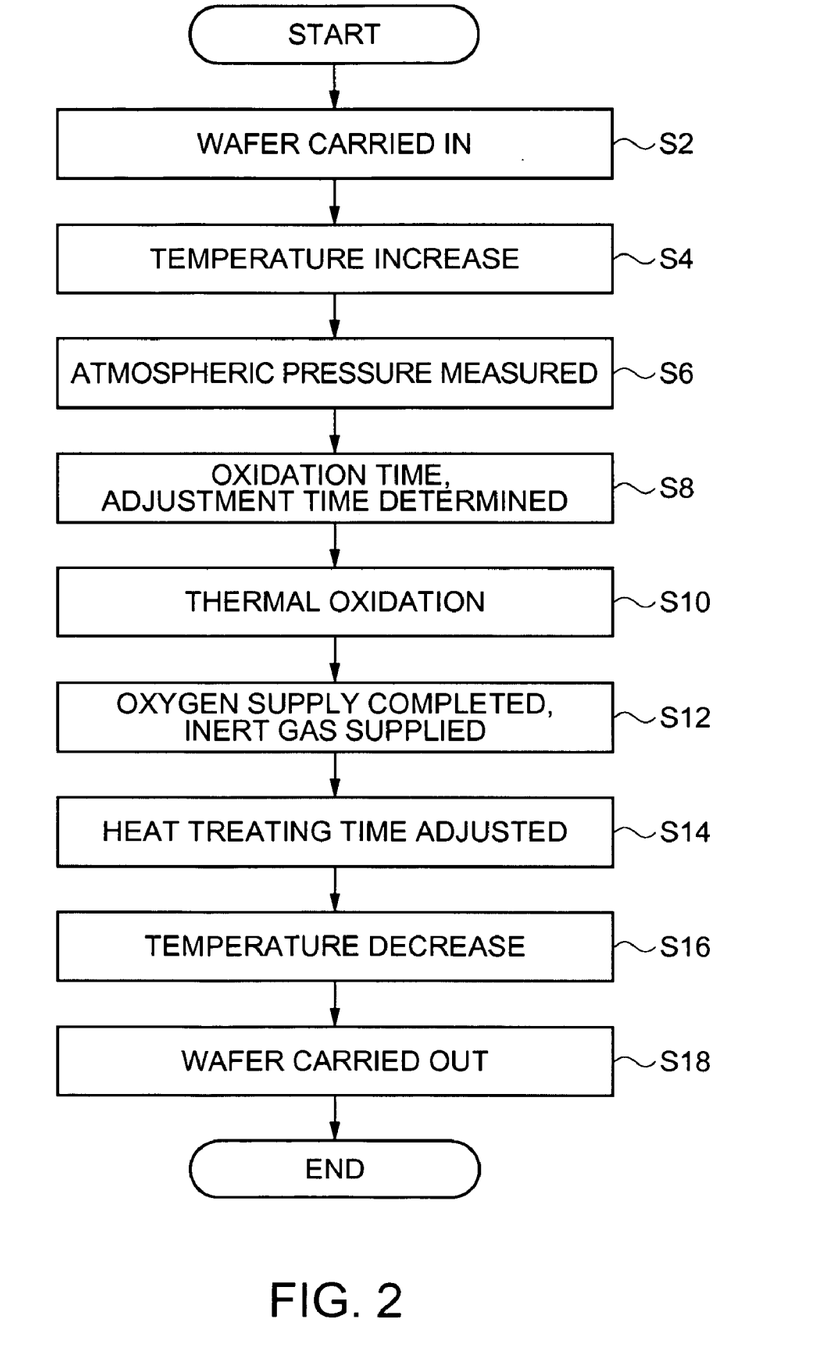
FIG. 2 is a flowchart showing an example of first operation of a semiconductor manufacturing device according to a first embodiment of the invention.

FIG. 2 is a flowchart showing the example of first operation of the semiconductor manufacturing device. In the first operation, heat treatment to adjust the thermal history is conducted on the silicon wafer 1 after the thermal oxidation treatment is carried out.

The inside of the reaction chamber 3 is controlled by the heater 7 at a standby temperature (for example, 800° C.) in advance. First, the wafer boat 2 holding the plurality of silicon wafers 1 is carried into the reaction chamber 3 (S2). At this time, together with the oxidation seed, nitrogen or Ar is supplied, but other inert gas may be supplied into the reaction chamber 3 through un-illustrated piping. This silicon wafer 1 is such that the impurity has been introduced in advance into part of the surface layer.

Thereafter, the temperature inside the reaction chamber 3 is increased up to the temperature of the thermal oxidation processing (for example, 900° C.) (S4).

After the operation of S4, or in parallel to these operations or during the thermal oxidation processing, the following processing is carried out. First, the atmospheric pressure is gauged by the atmospheric pressure sensor 10 (S6), whereafter the oxidation rate is calculated by applying the atmospheric pressure to data of the database 9a. Next, based on the calculated oxidation rate, the thermal oxidation processing time is calculated.

After that, time for heat treatment for adjustment is calculated (S8). The time for heat treatment for adjustment is set so that a sum of it and the thermal oxidation processing time remains constant at all times. Specifically, the total heat-treating time is preset, and by subtracting the thermal oxidation processing time from this total heat-treating time, the heat-treating time for adjustment is calculated.

And the silicon wafers 1 are subjected to thermal oxidation processing in the calculated time, (S10). Then, only the inert gas (for example, nitrogen or Ar) is supplied to the reaction chamber 3, while oxygen and the like inside the reaction chamber 3 are discharged from a gas discharge pipe 5 (S12). At this time, it may be arranged such that the gas flow rate is temporarily increased to enable oxygen and the like inside the reaction chamber 3 to be discharged from the gas discharge pipe rapidly.

This makes it possible to fill the inside of the reaction chamber 3 with the inert gas. In this condition, the temperature inside the reaction chamber 3 is maintained at the same temperature as when heat-treating. In this manner, heat treatment for adjusting the thermal history is carried out on the silicon wafers 1 (S14).

When the heat treatment for adjustment is carried out during time determined at S8, an output of the heater 7 is weakened and the temperature inside the reaction chamber 3 decreases to the standby temperature (S16). Thereafter, the wafer boat 2 and the silicon wafers 1 are carried out of the reaction chamber 3 (S18).

Figure 3A:
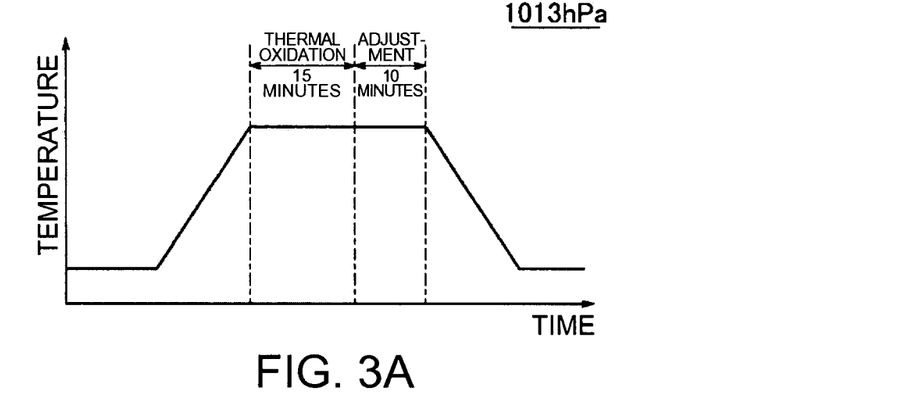
FIGS. 3A, B, and C are respectively charts showing thermal histories of silicon wafers in the example of first operation.

FIG. 3A is a chart showing the thermal history of the silicon wafer 1 when the atmospheric pressure is at an average value (for example, 1013 hPa). In FIG. 3A, after thermal oxidation of the silicon wafer 1 is carried out about 15 minutes, the heat treatment for adjusting thermal history is carried out for about 10 minutes.

Figure 3B:
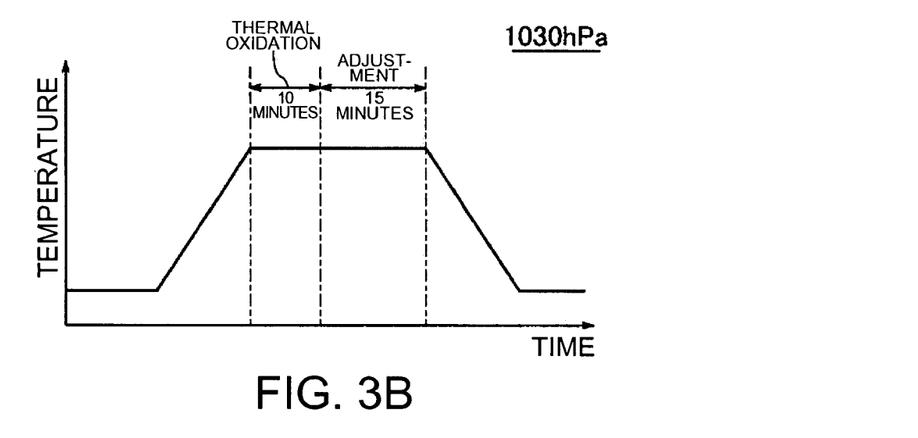

FIG. 3B is a chart showing the thermal history of the silicon wafer 1 when the atmospheric pressure is higher than an average value (for example, 1030 hPa). When the atmospheric pressure is higher than the average value, the oxidation rate of the silicon wafer 1 becomes faster, so that as compared to a case of FIG. 3A, the thermal oxidation processing time becomes short (for example, 10 minutes).

However, the heat treatment carried out thereafter becomes longer (for example, 15 minutes) for a portion of the thermal oxidation processing time which became shorter (for example, 5 minutes). Consequently, the total heat-treating time is the same (for example, 25 minutes) as the case shown in FIG. 3A.

Figure 3C:
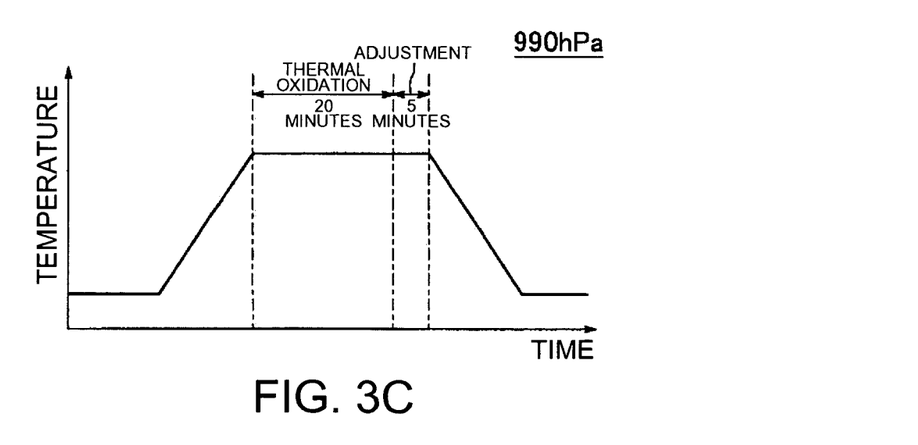

FIG. 3C is a chart showing the thermal history of the silicon wafer 1 when the atmospheric pressure is lower than the average value (for example, 990 hPa). When the atmospheric pressure is lower than the average value, the oxidation rate of the silicon wafer 1 becomes slow, so that as compared-to the case of FIG. 3A, the thermal oxidation processing time becomes long (for example, 20 minutes).

However, the heat treatment carried out thereafter becomes short (for example, 5 minutes) for a portion of the thermal oxidation processing time which became longer (for example, 5 minutes). Consequently, the total heat-treating time is the same (for example, 25 minutes) as the case shown in FIG. 3A.

In this manner, in the example of the first operation, the silicon wafer 1 is subjected to heat-treating to adjust the thermal history after the thermal oxidation processing. In the heat treatment for thermal history adjustment, the temperature of the silicon wafer 1 is controlled such as to be the same as at the time of the thermal oxidation processing, and also the heat-treating time is controlled such that a sum of it and the thermal oxidation processing time is constant at all times.

Consequently, the thermal history of the silicon wafer 1 becomes constant even if the atmospheric pressure should fluctuate to vary the thermal oxidation processing time. Accordingly, it is possible to suppress scattering of the diffusion profile of the impurity inside the silicon wafer 1 per lot.

Figure 4:
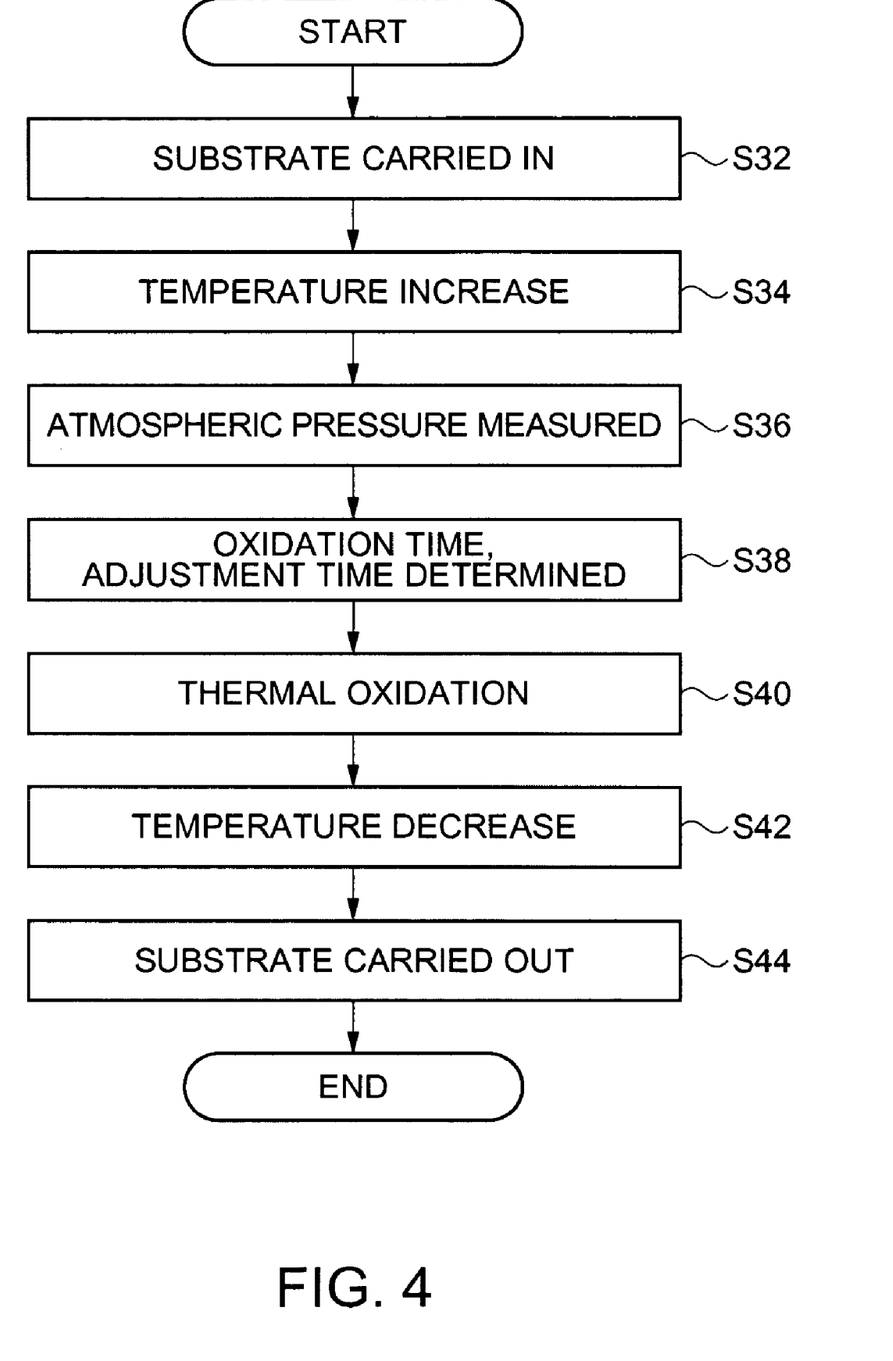
FIG. 4 is a flowchart showing an example of second operation of a semiconductor manufacturing device according to a first embodiment of the invention.

FIG. 4 is a flowchart showing an example of second operation of the semiconductor manufacturing device. In the example of the second operation, if the thermal oxidation processing time should fluctuate, it is arranged such that the rate of decreasing the temperature of the silicon; wafer 1 after the thermal oxidation processing will change.

The inside of the reaction chamber 3 is controlled at the standby temperature (for example, 800° C.) in advance. First, the wafer boat 2 holding the plurality of silicon wafers 1 is carried into the reaction chamber 3 (S32). This silicon wafer 1 is such that the impurity has been introduced in advance into part of the surface layer.

Thereafter, the temperature inside the reaction chamber 3 is increased (for example, 900° C.) up to the temperature of the thermal oxidation processing (S34).

Further, after S34, or in parallel to these operations or during the thermal oxidation processing, the following processing is carried out. First, the atmospheric pressure is gauged by the atmospheric pressure sensor 10 (S36). Then, the same processing as the example of the first operation is carried out, and the thermal oxidation processing time is calculated. Thereafter, the rate of decreasing the temperature after the thermal oxidation processing is carried out is set (S38).

The rate of decreasing the temperature is set based on the thermal oxidation processing time, temperature of thermal oxidation processing, the diffusion coefficient and concentration of the impurity introduced into the silicon wafer 1, so that the thermal history of the silicon wafer 1 may become the same. For this setting, data stored in the database 9a is used.

The data used herein may be what compares the thermal oxidation time, the thermal oxidation processing temperature, the type of the impurity and the concentration of the impurity to the rate of decreasing the temperature in a table format. Or it may be a numerical expression to calculate the rate of decreasing the temperature from the thermal oxidation time, the thermal oxidation processing temperature, the type of the impurity and the concentration of the impurity.

And the silicon wafer 1 is subjected to thermal oxidation processing in the calculated time (S40). Thereafter, the output of the heater 7 falls and the temperature inside the reaction chamber 3 falls to the standby temperature (S42). At this time, the output of the heater 7 is controlled such that the rate of decreasing the temperature may become the rate set in S38. Thereafter, the silicon wafers 1 are carried out (S44) by taking the wafer boat 2 out of the reaction chamber 3.

Figure 5A:
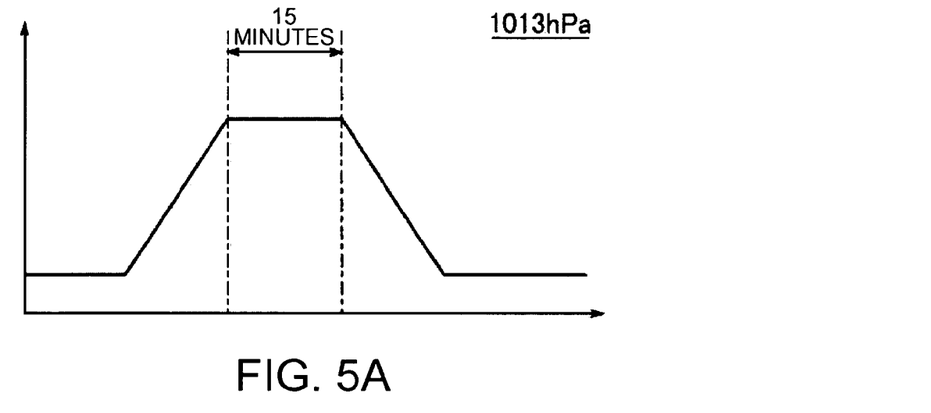
FIGS. 5A, B, and C are respectively charts showing thermal histories of silicon wafers in the example of second operation.

FIG. 6A is a chart showing the thermal history of the silicon wafer 1 when the atmospheric pressure is the average value (for example, 1013 hPa). In the example of FIG. 5A, the silicon wafer 1 is subjected to thermal oxidation for about 15 minutes. After that, the temperature inside the reaction chamber 3 falls at a standard rate.

Figure 5B:
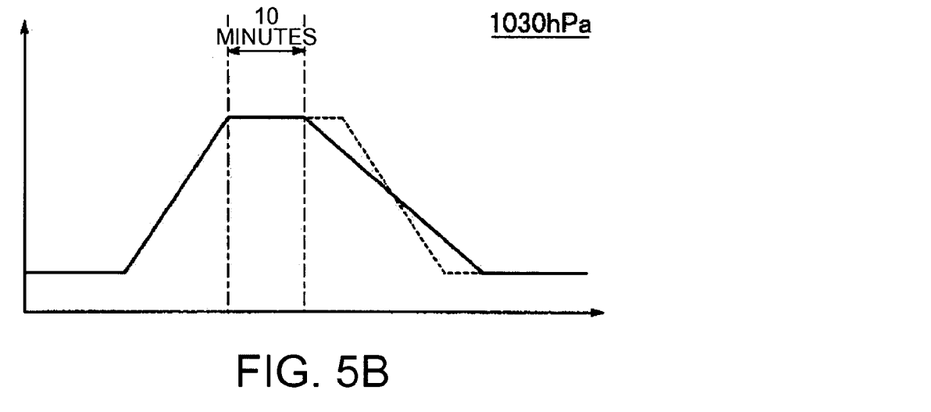

FIG. 5B is a chart showing the thermal history of the silicon wafer 1 when the atmospheric pressure is higher than the average value (for example, 1030 hPa). When the atmospheric pressure is higher than the average value, the oxidation rate of the silicon wafer 1 becomes faster, so that as compared to the case of FIG. 5A, the thermal oxidation processing time becomes short (for example, 10 minutes).

However, the subsequent rate of decreasing the temperature becomes mild as compared to the case of FIG. 5A and time for the temperature to drop to the standby temperature becomes long. Consequently, by adjusting the rate of decreasing the temperature, it is possible to make the thermal history of the silicon wafer 1 the same as the case of FIG. 5A.

Figure 5C:
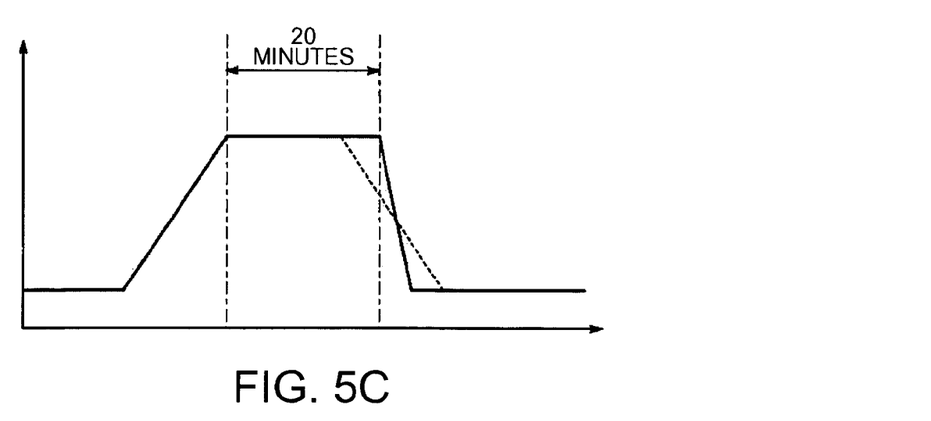

FIG. 5C is a chart showing the thermal history of the silicon wafer 1 when the atmospheric pressure is lower than the average value (for example, 990 hPa). When the atmospheric pressure is lower than the average value, the oxidation rate of the silicon wafer 1 becomes slow, so that as compared to the case of FIG. 5A, the thermal oxidation processing time becomes long (for example, 20 minutes).

However, the subsequent rate of decreasing the temperature becomes rapid as compared to the case of FIG. 5A and the time for the temperature to drop to the standby temperature becomes short. Consequently, by adjusting the rate of decreasing the temperature, it is possible to make the thermal history of the silicon wafer 1 the same as the case of FIG. 5A.

In this manner, in the example of the second operation in the heat treatment for thermal history adjustment, the temperature of the silicon wafer 1 is controlled such as to be the same as at the time of thermal oxidation processing. Consequently, the thermal history of the silicon wafer 1 becomes constant even if the atmospheric pressure should fluctuate to vary the thermal oxidation processing time. Accordingly, it is possible to suppress scattering of the diffusion profile of the impurity inside the silicon wafer 1 per lot.

It should be noted that the rate of decreasing the temperature does not need to be constant and may be changed during a temperature drop. For example, immediately upon completion of the thermal oxidation processing, it may be made small and thereafter large.

Further, if the same piping, the flow rate control mechanism, the control, the atmospheric pressure sensor and the database as the embodiment are provided on a thermal oxidation device of an lamp anneal type, the same operation/working-effect as the embodiment may be obtained.

Further, the thermal oxidation time is adjusted for the semiconductor manufacturing device of the embodiment to correct effect due to the fluctuation of the atmospheric pressure. However, the effect due to the fluctuation of the atmospheric pressure may be corrected by adjusting the thermal oxidation temperature. For example, as the atmospheric pressure. rises, the thermal oxidation temperature is lowered, while, as the atmospheric pressure falls, the thermal oxidation temperature is raised.

In this case, too, although the thermal history of the silicon wafer 1 fluctuates, in the same way as the above-referenced examples of operation, so long as the semiconductor manufacturing device adjusts the heat-treating time for adjustment or the rate of decreasing the temperature after the thermal oxidation processing, it is possible to suppress the fluctuation of the thermal history.

Next, a semiconductor manufacturing device according to a second embodiment will be described. The semiconductor manufacturing device according to the embodiment is a CVD device of the ordinary pressure type. A configuration of the semiconductor manufacturing device is the same as the semiconductor manufacturing device shown in FIG. 1 regarding the first embodiment, except for the gas supply tube 4a supplying the raw material gas for CVD to the reaction chamber 3. This is a point that separates it from the first embodiment.

In CVD, pressure is an important parameter to control a cumulative rate. As a result, in a CVD device of the ordinary pressure type, when the atmospheric pressure fluctuates, the cumulative rate changes. To correct this, the CVD processing time varies with the fluctuation of the atmospheric pressure in the semiconductor manufacturing device.

However, when the CVD processing time fluctuates, the thermal history of the silicon wafer 1 fluctuates as well. Therefore, the semiconductor manufacturing device suppresses the fluctuation of the thermal history due to the fluctuation of the atmospheric pressure through heat-treating for adjustment after the CVD processing (first operation) as shown below.

Further, the semiconductor manufacturing device absorbs the fluctuation of the thermal history due to the fluctuation of the atmospheric pressure by adjusting the rate of decreasing the temperature after the CVD processing (second operation).

Figure 6:
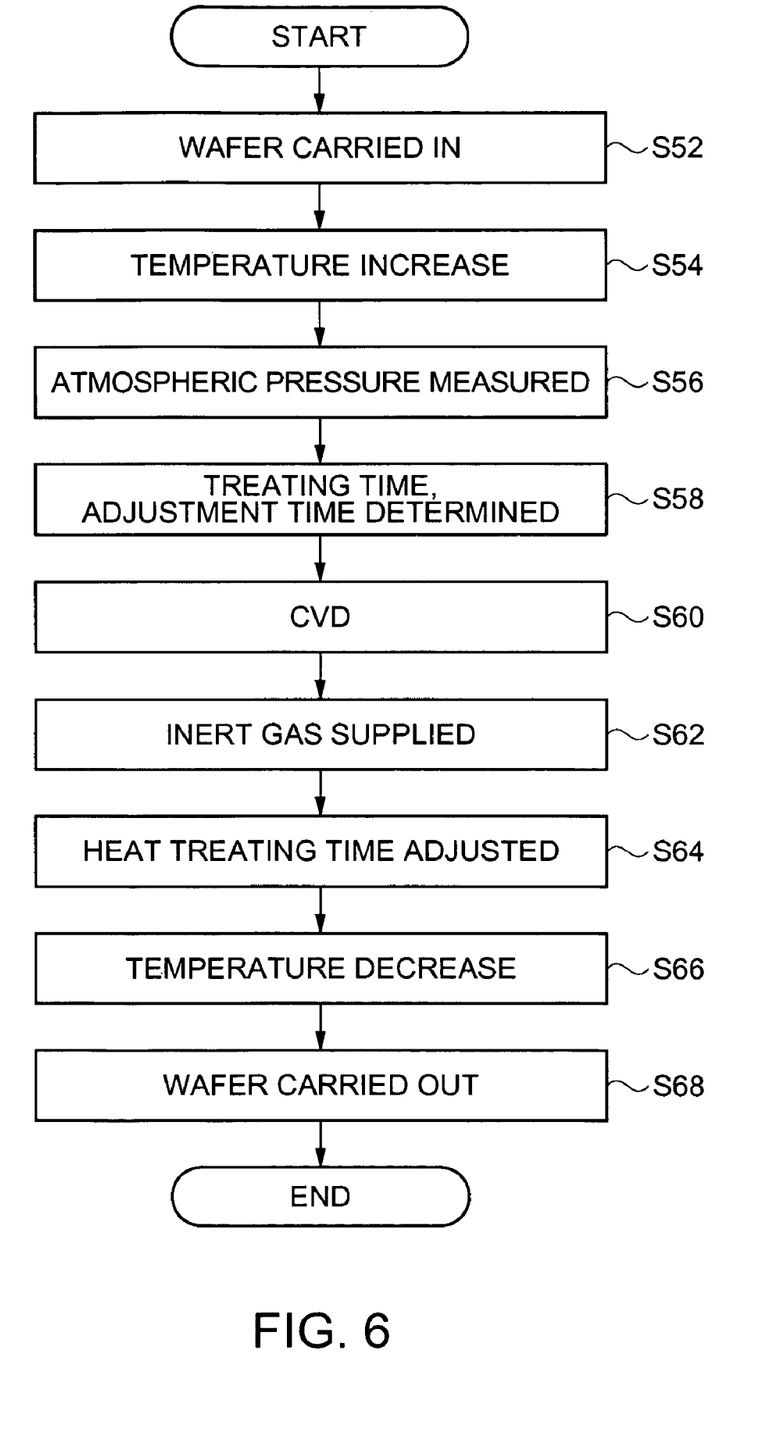
FIG. 6 is a flowchart showing an example of first operation of a semiconductor manufacturing device according to a second embodiment of the invention.

FIG. 6 is a flowchart to explain the first operation of the semiconductor manufacturing device. First, the wafer boat 2 holding the plurality of the silicon wafers 1 is carried into the reaction chamber 3 (S52). This silicon wafer 1 is such that the impurity has been introduced in advance into part of the surface layer. Then, the temperature inside the reaction chamber 3 is increased up to the temperature of the thermal oxidation processing (S54).

After S54, or in parallel to these operations or during the thermal oxidation processing, the following processing is carried out. First, the atmospheric pressure is gauged by the atmospheric pressure sensor 10 (S56). Next, the oxidation rate is calculated by applying the atmospheric pressure to data of the database 9a (S58). Data in the database 9a is, for example, data of a table format which compares the atmospheric pressure to the cumulative rate, or a numerical expression showing a relationship between the atmospheric pressure and the cumulative rate.

And the control 5 calculates the time for heat treatment for adjustment (S58). The time for the heat treatment for adjustment is set so that a sum of it and the CVD processing time remains constant at all times. Specifically, the total heat-treating time is preset, and by subtracting the thermal oxidation processing time from this total heat-treating time, the heat-treating time for adjustment is calculated.

When the temperature inside the reaction chamber 3 increases to the CVD processing temperature, the raw material gas for CVD processing is supplied to inside the reaction chamber 3 and the CVD processing is carried out (S60).

When the CVD processing is carried out for a period of time calculated in S58, only the inert gas (for example, nitrogen or Ar) is supplied into the reaction chamber 3 (S62). At this time, it may be arranged such that the gas flow rate is temporarily increased to make the raw material gas inside the reaction chamber 3 to be discharged rapidly from the gas discharge pipe 5.

This enables the inside of the reaction chamber 3 to be filled with the inert gas. As the temperature inside the reaction chamber 3 is maintained at the same temperature as when heat-treating in this condition, the silicon wafers 1 are subjected to heat treatment to adjust the thermo history (S64).

When the heat treatment for adjustment is carried out for the period of time determined in S58, the output of the heater 7 decreases and the temperature inside the reaction chamber 3 falls (S66). Subsequently, the wafer boat 2 and the silicon wafers 1 are carried out of the reaction chamber 3 (S68).

According to this first operation, after the CVD processing, the silicon wafer 1 is subjected to heat treatment for thermal history adjustment in the inert gas atmosphere. In this heat treatment for thermal history adjustment, the temperature of the silicon wafer 1 is controlled such as to be the same as at the time of the CVD processing, and, further, the heat-treating time is set so that a sum of it and the CVD processing time remains constant.

Consequently, the heat-treating time of the silicon wafer 1, that is, thermal history, is adjusted to be constant even if the CVD processing time should fluctuate due to fluctuation of the atmospheric pressure. Hence, it is possible to suppress the scattering of the diffusion profile of the impurity inside the silicon wafer 1.

Figure 7:
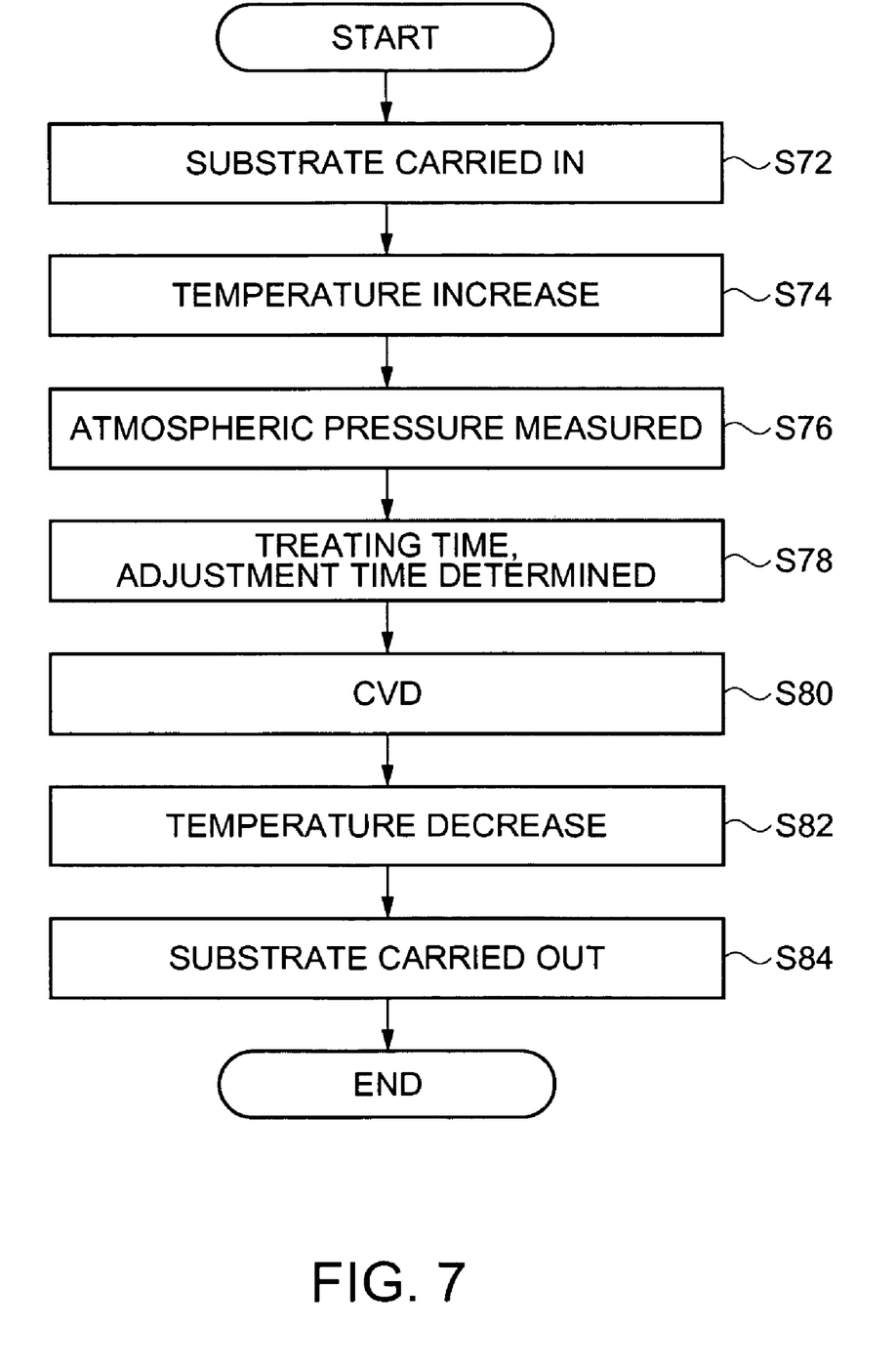
FIG. 7 a flowchart showing the example of second operation of a semiconductor manufacturing device according to a second embodiment of the invention.

FIG. 7 is a flowchart to explain the example of the second operation of the semiconductor manufacturing device. First, the wafer boat 2 holding a plurality of the silicon wafers 1 is carried into the reaction chamber 3 (S72). This silicon wafer 1 is such that the impurity has been introduced in advance into part of the surface layer. And, the temperature inside the reaction chamber 3 rises up to the temperature of the CVD processing (S74).

After S74, or in parallel to these operations or during the CVD processing, the atmospheric pressure is gauged by the atmospheric pressure sensor 10 (S76). Next, the CVD processing time is calculated by applying the atmospheric pressure to data of the database 9a. This calculation method is the same as the example of the first operation. And the control 5 calculates the rate of decreasing the temperature after the CVD processing is carried out (S78).

The rate of decreasing the temperature is set based on the CVD processing time, the CVD processing temperature, the diffusion coefficient of the impurity introduced to the silicon wafer 1 and the concentration of the impurity so that the thermal history of the silicon wafer 1 becomes the same. In this setting, data stored in the database 9a is utilized.

When the temperature inside the reaction chamber 3 increases to the CVD processing temperature, the raw material gas for CVD processing is supplied to inside the reaction chamber 3 and the CVD processing is carried out (S80). Thereafter, the output of the heater 7 decreases and the temperature inside the reaction chamber 3 falls (S82). At this time, the output of the heater 7 is controlled such that the rate of decreasing the, temperature may be the rate set in S78. After that, the wafer boat 2 and the silicon wafers 1 are carried out of the reaction chamber 3 (S84).

In this manner, in the second operation, the rate of decreasing the temperature after the CVD processing is adjusted such that the thermal history of the silicon wafer 1 may be constant. Consequently, it is adjusted so that the thermal history of the silicon wafer 1 becomes constant even if the CVD processing time of the silicon wafer 1 should fluctuate due to the fluctuation of the atmospheric pressure. Accordingly, it is possible to suppress the scattering of the diffusion profile of the impurity inside the silicon wafer 1.

It should be noted that the rate of decreasing the temperature does not need to be constant but may be changed during the temperature drop. For example, it may be made small immediately upon completion of the CVD processing and large after that.

Figure 8A:
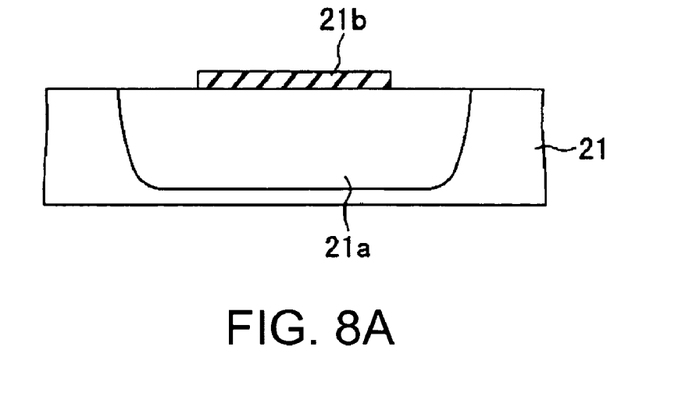
FIG. 8A is a sectional view to explain a manufacturing method of a semiconductor device according to a third embodiment.
Figure 8B:
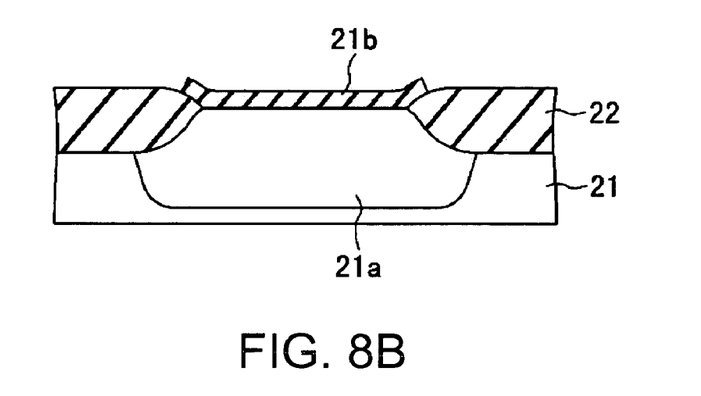
FIG. 8B is a sectional view to explain a next process of FIG. 8A.
Figure 8C:
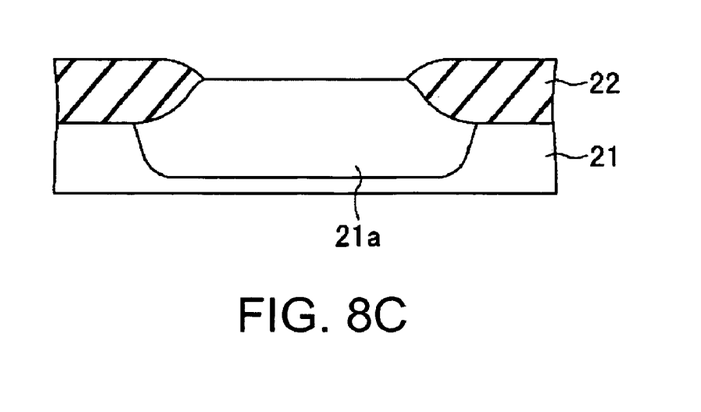
FIG. 8C is a sectional view to explain a next process of FIG. 8B.
Figure 9A:
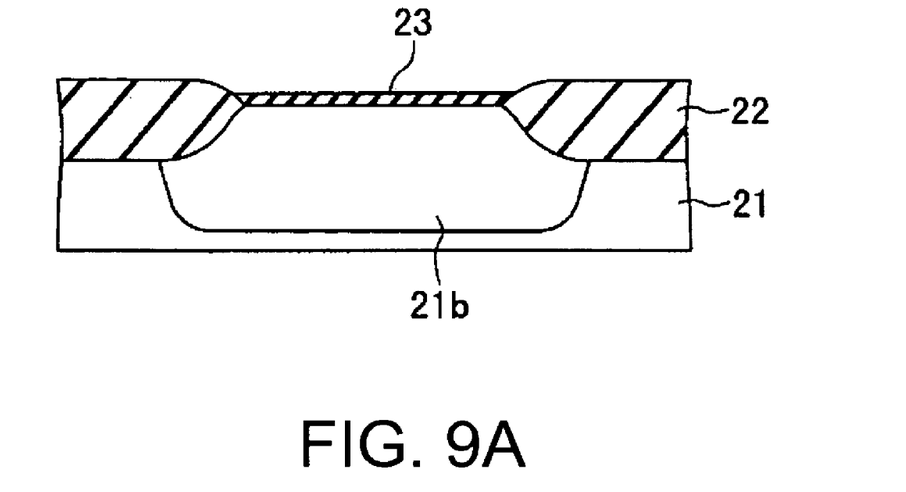
FIG. 9A is a sectional view to explain a next process of FIG. 8C, and B is a sectional view to explain a next process of FIG. 9A.
Figure 9B:
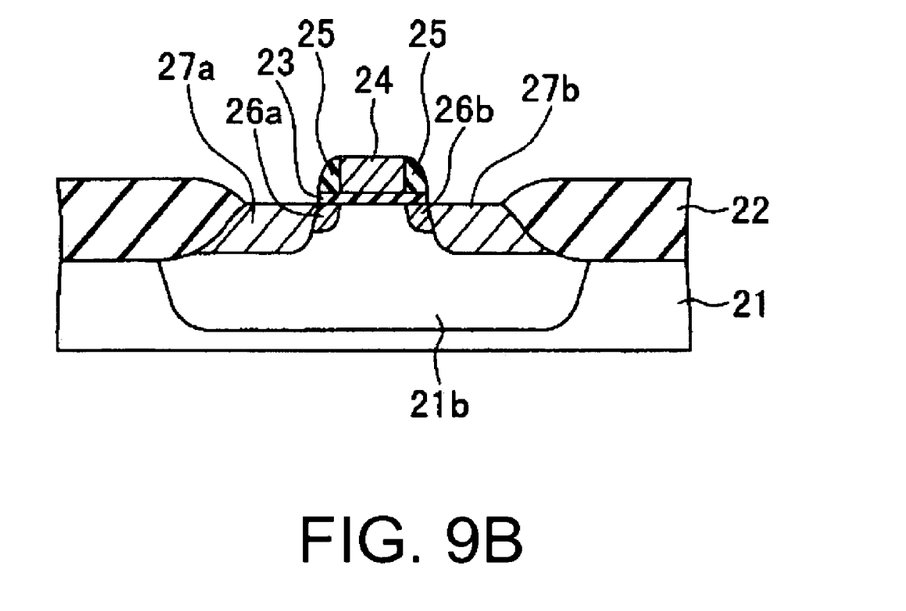

FIG. 8 and FIG. 9 are sectional views to explain a manufacturing method of a semiconductor device according to a third embodiment. In the embodiment, for thermal oxidation of a silicon substrate, a semiconductor device according to the first embodiment is employed.

First, as shown in FIG. 8A, an un-illustrated mask is formed on a silicon substrate 21. This mask may be a photoresist pattern or what is patterned from another film. Next, an impurity ion of a first conductive type (for example, a p-type impurity) is injected into the silicon substrate 21. By this means, a well 21a is formed on the silicon substrate 21. Thereafter, the mask is removed. Then, a silicon nitride film 21b is formed on the silicon substrate 21, and this silicon nitride film 21b is removed except a portion above a center of the well 21a.

Next, as shown in FIG. 8B, the silicon substrate 21 is subjected to thermal oxidation while leaving the silicon nitride film 21b. By this means, a portion of the silicon substrate 21 not covered by the silicon nitride film, 21b is oxidized, forming an element separation film 22 composed of silicon oxide. Since the semiconductor device according to the first embodiment is used for this thermal oxidation, the scattering of the impurity profile of the well 21a is suppressed. After that, as shown in FIG. 8C, the silicon nitride film 21b is removed.

Next, as shown in FIG. 9A, by subjecting the silicon substrate 21 to thermal oxidation, a gate oxide film 23 is formed on the surface of the silicon substrate 21. Since the semiconductor device according to the first embodiment is used, the scattering of the thickness of the gate oxide film and the scattering of the impurity profile of the well 21a are respectively suppressed.

Next, as shown in FIG. 9B, a polysilicon film is deposited on the entire surface including the gate oxide film 23, and this polysilicon film is subjected to patterning. By this means, a gate electrode 24 is formed on the gate oxide film 23. Then, an impurity ion of a second conductive type (for example, an n-type impurity) is injected with the gate electrode 24 and the element separation film 22 as masks. By this means, low concentration impurity areas 26a and 26b are formed on the silicon substrate 1.

Next, a silicon oxide film is formed on the gate oxide film 23 and this silicon oxide film is etched back. This causes a sidewall 25 to be formed on the sidewall of the gate electrode 24. Then, the impurity ion of the second conductive type is injected into the silicon substrate 21 with the gate electrode 24, the sidewall 25, and the element separation film 22 as masks. By this means, impurity areas 27a and 27b which will become a source and a drain are formed.

In this manner, a transistor is formed on the silicon substrate 21.

According to the embodiment, when forming the element separation film 22 as well as forming the gate oxide film 23, the semiconductor manufacturing device shown in the first embodiment is used for respective cases. As a result, the scattering of the impurity profile of the well 21a is suppressed, and the scattering of electrical characteristics of a transistor is suppressed.

It should be noted that this invention is not limited to the above-referenced embodiments but may be carried out in various forms within the scope and spirit of the invention.

What is claimed is:

1. A manufacturing method of a semiconductor device, comprising:

heat-treating a semiconductor substrate under an ordinary pressure and in an oxidizing atmosphere; and heat-treating the semiconductor substrate under the ordinary pressure and in an inert atmosphere, wherein heat-treating time or heat-treating temperature in heat treatment in the oxidizing atmosphere is changed based on fluctuation of atmospheric pressure, and the heat-treating time in the inert atmosphere is determined based on the heat-treating time or the heat-treating temperature in the oxidizing atmosphere.

2. The manufacturing method of a semiconductor device according to claim 1, wherein, in the process of heat-treating in the inert atmosphere, the heat-treating time of the semiconductor substrate is changed such that a thermal history of the semiconductor substrate may be substantially constant.

3. The manufacturing method of a semiconductor device according to claim 1, wherein, in the process of heat-treating in the inert atmosphere, the heat-treating temperature is made substantially the same as the heat-treating temperature in the oxidizing atmosphere.

4. The manufacturing method of a semiconductor device according to claim 3, wherein, in the process of heat-treating in the oxidizing atmosphere, the heat-treating time is changed according to the fluctuation of the atmospheric pressure, and in the process of heat-treating in the inert atmosphere, the heat-treating time is set such that a sum of the heat-treating time in the inert atmosphere and the heat-treating time in the oxidizing atmosphere may be substantially constant.

5. The manufacturing method of a semiconductor device, comprising:

heat-treating a semiconductor substrate under the ordinary pressure and in an oxidizing atmosphere; and decreasing the temperature of the semiconductor substrate after oxidation processing, wherein the heat-treating time or the heat-treating temperature in the heat treatment in the oxidizing atmosphere is changed based on the fluctuation of the atmospheric pressure, and in the process of decreasing a temperature of the semiconductor substrate, a rate of decreasing the temperature after the oxidation processing of the semiconductor substrate based on the heat-treating time or heat-treating temperature is set.

6. The manufacturing method of a semiconductor device according to claim 5, wherein, in the process of decreasing the temperature of the semiconductor substrate having a process of injecting an impurity into the semiconductor substrate prior to the process of heat-treating in the oxidizing atmosphere, the rate of decreasing the temperature of the semiconductor substrate may be set based on a diffusion coefficient of the impurity, the heat-treating temperature of the semiconductor substrate, and a concentration of the impurity in the semiconductor substrate, in addition to the heat-treating time in the oxidizing atmosphere.

7. The manufacturing method of a semiconductor device according to claim 1, further comprising:
   injecting the impurity into the semiconductor substrate prior to the process of heat-treating in the oxidizing atmosphere.

8. The manufacturing method of a semiconductor device according to claim 6, wherein the process of injecting the impurity into the semiconductor substrate is a process of forming a well in the semiconductor substrate.

9. The manufacturing method of a semiconductor device according to claim 1, wherein the process of heat-treating in the oxidizing atmosphere is a process of forming a gate oxide film on the semiconductor substrate.

* * * * *

UNITED STATES PATENT AND TRADEMARK OFFICE
CERTIFICATE OF CORRECTION

| | |
|---|---|
| PATENT NO. | : 7,332,448 B2 |
| APPLICATION NO. | : 11/207064 |
| DATED | : February 19, 2008 |
| INVENTOR(S) | : Shinji Terao |

Page 1 of 1

It is certified that error appears in the above-identified patent and that said Letters Patent is hereby corrected as shown below:

Column 8, Line 20: "FIG. 6A" should be --FIG. 5A--

Signed and Sealed this

Fifteenth Day of July, 2008

JON W. DUDAS
*Director of the United States Patent and Trademark Office*